United States Patent
Pagan

(10) Patent No.: US 11,029,608 B2
(45) Date of Patent: Jun. 8, 2021

(54) METHOD AND EXPOSURE DEVICE FOR EXPOSING AT LEAST ONE STORED REPRESENTATION ON A LIGHT-SENSITIVE RECORDING MEDIUM

(71) Applicant: MIVA TECHNOLOGIES GMBH, Schonaich (DE)

(72) Inventor: Robin Pagan, Stuttgart (DE)

(*) Notice: Subject to any disclaimer, the term of this patent is extended or adjusted under 35 U.S.C. 154(b) by 0 days.

(21) Appl. No.: 16/652,057

(22) PCT Filed: Oct. 8, 2018

(86) PCT No.: PCT/EP2018/077246
§ 371 (c)(1),
(2) Date: Mar. 29, 2020

(87) PCT Pub. No.: WO2019/072727
PCT Pub. Date: Apr. 18, 2019

(65) Prior Publication Data
US 2020/0249579 A1   Aug. 6, 2020

(30) Foreign Application Priority Data
Oct. 11, 2017 (DE) .................... 10 2017 123 686.4

(51) Int. Cl.
*G03F 7/20* (2006.01)
(52) U.S. Cl.
CPC ...... *G03F 7/70383* (2013.01); *G03F 7/70141* (2013.01)

(58) Field of Classification Search
CPC .................... G03F 7/2051; G03F 7/70383
See application file for complete search history.

(56) References Cited

U.S. PATENT DOCUMENTS

| | | | |
|---|---|---|---|
| 2008/0316458 A1* | 12/2008 | Sumi | B41J 2/465 355/69 |
| 2009/0092288 A1 | 4/2009 | Uemura | |
| 2014/0146299 A1 | 5/2014 | Nomura | |
| 2018/0321595 A1* | 11/2018 | Ruecker | G03F 7/70433 |
| 2019/0227442 A1* | 7/2019 | Smakman | G03F 7/70508 |

\* cited by examiner

*Primary Examiner* — Steven Whitesell Gordon
(74) *Attorney, Agent, or Firm* — Mark Wisnosky

(57) ABSTRACT

The invention relates to a method for exposing at least one stored image (21) on a light-sensitive recording medium (14), with an exposure device (11), which picks up at least one recording medium (14) on a support (12), with at least one exposure head (16, 17), which is moved above the support (12) along a guiding axis (18) in the X direction and the guiding axis (18) and/or the support (12) are moved in the Y direction, with a control system, by which a traversing movement of the at least one exposure head (16, 17) is operated for exposing the at least one image (21) of the recording medium (14) and/or the recording medium (14), wherein the position of the recording medium (14) and/or the position of the at least one image (21) on the recording medium (14) are detected with at least one linear image acquisition device (25), which extends at least partially in the X direction.

11 Claims, 2 Drawing Sheets

METHOD AND EXPOSURE DEVICE FOR EXPOSING AT LEAST ONE STORED REPRESENTATION ON A LIGHT-SENSITIVE RECORDING MEDIUM

CROSS-REFERENCE TO RELATED APPLICATIONS

This application is a U.S. National phase application of PCT/EP2018/077246, filed on Oct. 8, 2018, which claims priority to German patent application DE 10 2017 123 686.4 filed on Oct. 11, 2017 all by the same inventor.

STATEMENT REGARDING FEDERALLY SPONSORED RESEARCH OR DEVELOPMENT

Not Applicable.

BACKGROUND OF THE INVENTION

Field of the Invention

The invention relates to a method for exposing at least one stored image on a light-sensitive recording medium and an exposure device for carrying out the method.

Description of Related Art

An exposure device is known from US 2009/0092288 A1, which comprises several exposure devices arranged along a linear axis. This linear axis is moveable, perpendicularly to the direction of extension, towards an object to be exposed. Moreover, a plurality of adjacently arranged individual cameras, each having a lens, is arranged on this linear axis. The orientation of a mark is detected by these cameras.

Furthermore, an exposure device is known from US 2014/0146299 A1. Before the exposure of an object is carried out, an optionally required correction in the orientation of the object to be exposed takes place. With a first camera and a second camera, at a distance therefrom, of an orientation correction device, a first and a second alignment mark are detected, for the substrate to be exposed to be aligned if necessary. An exposure device is known from DE 20 2016 001 967 U1 that has at least two exposure heads moveable on a common guiding axis, which are moveable above a support for a recording medium. These exposure heads are displaceable along a moveable guiding axis in the X direction, wherein the moveable guiding axis is moveable in the Y direction. By this means, the exposure heads can be oriented in various positions relative to the recording medium, in order to expose stored images on a flat light-sensitive recording medium.

For detecting the recording medium placed on the support, it is known that each of the exposure heads comprises a special industrial camera. At least two measuring points are applied on the recording medium, in order to detect possible displacements and/or twisting of the recording medium on the support. The special industrial camera is moved towards the recording medium in such a way that it is aligned on the region of the measuring point in a presumed target position. Then the actual position is detected by the camera. Deviations of the detected actual position from the target position are detected by the camera automatically and sent to a computer program, for a correction to be calculated. Moreover, it may be provided that, in addition to the measuring points on the recording medium, measuring points of a use or an image on the recording medium are also detected, for also detecting the position and/or orientation of the use to the recording medium and for comparing it with the stored target position. If there are deviations, once again correction calculations are carried out for the subsequent exposure.

After detecting the at least two measuring points on the recording medium and preferably further measuring points of the at least one use, an exposure routine is started, wherein in this exposure routine a correction calculation between the stored target position and the actual position has already taken place. In this exposure routine, for example the recording medium is subdivided into columns and the first and the second exposure head, some distance apart, are moved for example along column S1 and S3, and then moved in the opposite direction along column S2 and S4.

The problem to be solved by the invention is to detect the position of the recording medium and/or of the at least one image on the recording medium in a shorter process time.

BRIEF SUMMARY OF THE INVENTION

This problem is solved by a method for exposing at least one stored image on a light-sensitive recording medium, in which the position of the recording medium and/or the position of a single image on the recording medium is detected with at least one linear image acquisition device, which extends at least partially in the X direction. This makes it possible, during a traversing movement of the linear image acquisition device towards the support on which the recording medium rests or during a traversing movement of the support towards the linear image acquisition device or a relative movement of the linear image acquisition device and the support of the recording medium, for a complete image of the recording medium and/or of the at least one image to be detected by the at least one linear image acquisition device. Then the acquired data of the complete image are evaluated by a control device. Evaluation of the acquired complete image may take place specifically. For example, at least two or three points of the recording medium may be taken as a basis for detecting the position and/or orientation of the recording medium on the support. Also, only two or three points on the respective use or the respective image on the recording medium may be used for determining the position and/or orientation of the respective image. A combination of these may also take place. Exposure by means of at least one exposure head is controlled, adapting to the actually detected position of the recording medium and/or of the at least one image, i.e. the X/Y position and the orientation or alignment in the angular position of the recording medium and/or of the image. Therefore a traversing movement of the image acquisition device along or relative to the support may be sufficient to acquire the complete image from the recording medium or media resting on the support and/or image. This then makes it possible for the individual images for the subsequent exposure process to be approached immediately and directly with the at least one exposure head. The process time is reduced as a result.

Preferably the complete recording medium or media on the support are scanned and acquired by the single linear image acquisition device by means of a traversing movement, extending over the full width of the support. The position of the recording medium or media and/or the position of the at least one image of the recording medium are evaluated and then the at least one exposure head, preferably of two or more exposure heads, is operated for exposing the recording medium or media taking into account deviations of the actual position from the stored target position. The process time can thus be minimized considerably.

A further preferred configuration of the method provides that, after acquisition of the complete image of the recording medium and/or of the at least one image on the recording medium, the detected actual position is compared with the stored target positions of the recording medium and/or of the at least one image and a correction of the target position to the detected actual position is calculated and operated for the next exposure process. Tolerances in the manufacturing process of these recording media can thus be compensated. Moreover, the images to be exposed can be approached immediately.

Moreover, it may be provided that, after acquisition of the complete image of the recording medium and/or of the at least one image on the recording medium, the detected actual position is compared with the stored target position and scaling differences are detected and a correction of said scaling differences is calculated and operated for the next exposure process. Thus, changes in the plane of the recording medium and/or of the image, such as for example expansions or contractions, can be taken into account by this method, in order to carry out an optimum exposure process thereafter.

Preferably, it is provided that, for acquisition of the complete image, the at least one image acquisition device is operated with IR radiation and/or homogeneous visible LED illumination. For example, in the case of IR radiation it can be made possible for holes in the recording medium that are covered with the coating varnish to be detected exactly, as the coating varnish is not disturbing for IR radiation.

Moreover, preferably after complete acquisition of the recording medium and/or of the images or use on the recording medium, individual regions on the recording medium are determined and selected, which during subsequent exposure are not considered, and especially are not scaled and exposed. Only an adaptation in the position and in the angle can take place for controlling the exposure head. This is an advantage especially with objects, such as for example microchips without a housing or the like, which possess high accuracy and are not subject to general distortion due to production of the single-layer or multilayer recording medium.

The problem to be solved by the invention is, moreover, solved by an exposure device that has at least one linear image acquisition device, which extends at least partially in the X direction. This makes possible, by means of a traversing movement of the guiding axis along the support and/or recording medium relative to the guiding axis, complete detection of the position of the recording medium to the support and therefore to the guiding axis with the at least one exposure head arranged thereon with just one traversing movement. Detection of the position and/or orientation of the recording medium on the one hand and/or of the position and/or orientation of the at least one image on the recording medium on the other hand, means both the positioning in the X/Y direction and the orientation or the twisting or the angular offset. As a result, on the basis of correction of the required values by the detected actual values, exact exposure of the images by the at least one exposure head based on stored required values can be made possible for exposing the images on the recording medium.

Preferably the single linear image acquisition device extends at least in the X direction along the complete support or an exposure field of the at least one exposure head, preferably of two or more exposure heads, of the exposure device. This provides the advantage that by means of a single traversing movement, the complete support can be scanned and recording media lying thereon can be detected. For example, several recording media with different formats can be placed on the support. Detection of the whole respective recording medium is possible.

Advantageously, this linear image acquisition device is provided on the guiding axis of the at least one exposure head. This can create a compact design.

Alternatively, the linear image acquisition device may be provided on a linear axis, which is moveable in the Y direction independently of and separately from the guiding axis. This makes it possible to carry out an independent scan. With adequate detection of required values of the recording medium by the linear image acquisition device, exposure by means of the exposure heads can already be started.

According to an alternative embodiment of the exposure device, it may be provided that the linear image acquisition device is fixed on a housing opening of the exposure device or is moveable, via which the exposure device is accessible and the support can be moved at least partially out of the housing opening of the housing. This means that for example assembly of the support can take place outside the housing. On moving the support into an exposure position in the housing of the exposure device, detection of the complete image of the recording medium and/or of the at least one image are carried out by the image acquisition device assigned to the housing opening. After positioning of the support in the exposure position, the calculated correction values based on the stored target positions are already available for the next exposure process. The exposure process can begin and can be operated immediately.

The invention and further advantageous embodiments and variants thereof are described and explained in more detail hereunder, on the basis of the examples shown in the drawings. The features that can be seen from the description and the drawings can be applied according to the invention individually, or several together in any combination.

DETAILED DESCRIPTION OF THE INVENTION

Figure 1:
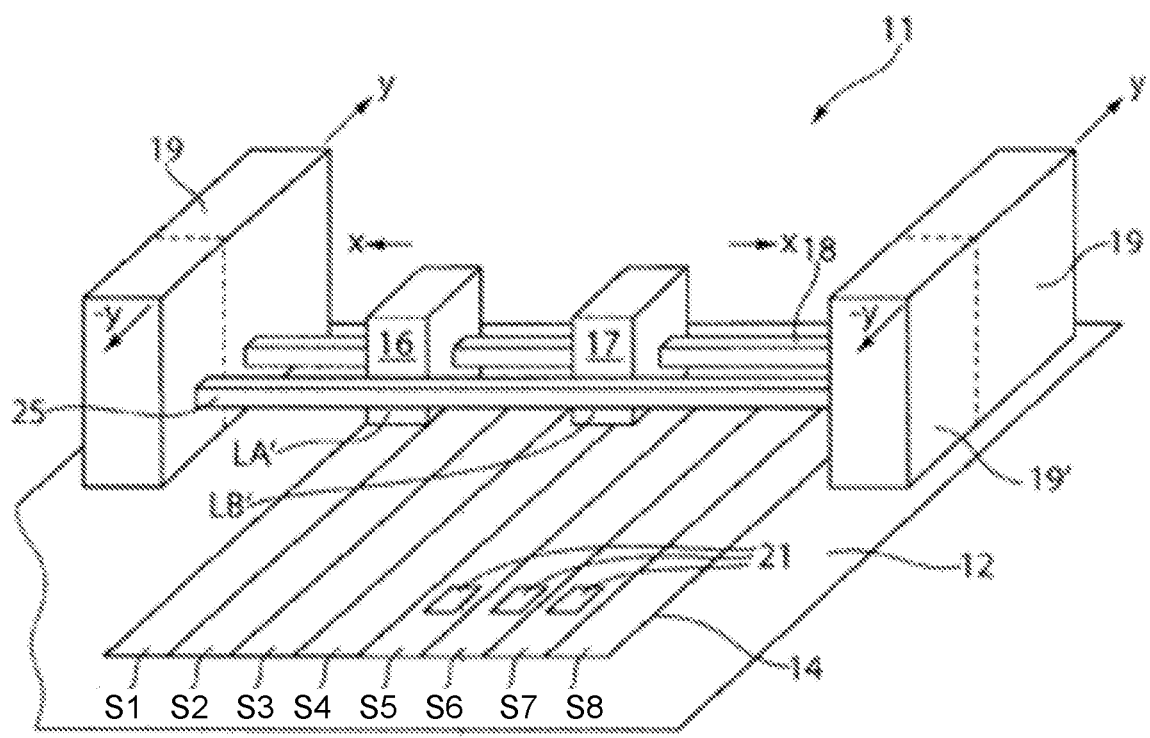
FIG. 1, a simplified, partial schematic representation of an exposure device.

FIG. 1 shows an exposure device 11, schematically simplified and only partially. This exposure device 11 comprises a support 12 for one or more recording media 14. These recording media 14 are in particular photographic templates for printed circuit boards and other objects that use phototechnical structures as part of the production process. In particular, resist-coated panels, UV films, solder resists, red-sensitive, orthochromatic films or masks may be provided as recording media. Exposure devices of this kind operate as so-called direct exposure systems. The support 12 of the exposure device 11 is provided on a machine main frame, which is not shown in more detail. The support 12 may for example be configured as a vacuum table, so that after placing and aligning the recording medium 14, a vacuum is applied, to fix the recording medium 14 to the support for exposure. Assigned to the support 12, especially above the support 12, at least two exposure heads 16, 17 are provided, which are configured to be moveable in the X direction along a guiding axis 18. The guiding axis 18 is moveable in the Y direction along the support 12 with a sliding arrangement 19. The sliding arrangement 19 and the exposure heads 16, 17 are controlled by a control device, which is not shown in more detail. The control device of the exposure device 11 is software-controlled. The displacement of the sliding arrangement 19 in the Y direction and of the exposure heads 16, 17 in the X direction takes place under software control by means of drives operating in translation, which are known per se.

For exposing the recording medium 14 or the at least one image 21 provided thereon, various exposure strategies may be used. For example, the recording medium 14 is divided up into columns S1, S2, . . . S8. Exposure preferably takes place by columns, wherein two selected columns spaced apart are always travelled over simultaneously by the exposure heads 16, 17 assigned to them and are exposed thereby. The column width preferably corresponds to the width of a light-beam sending field LA or LB of the respective exposure head. Exposure of a complete recording medium 14 of this kind is described in more detail in DE 20 2016 01 967 U1, to which reference is made in its entirety.

Before exposure begins, the position and/or orientation of the at least one recording medium 14 on the support 12 are detected. For determining a position and/or orientation of the recording medium 14 on the one hand and/or the position and/or orientation of at least one image 21 on the recording medium 14 on the other hand, at least two, preferably three or more measuring points of the recording medium 14 and/or of the at least one image 21 are acquired. This acquisition takes place with at least one linear image acquisition device 25. This at least one linear image acquisition device 25 extends in the X direction. By a traversing movement of the sliding arrangement 19 in the Y direction, the at least one linear image acquisition device 25 can be moved all the way along the support 12 and the whole two-dimensional extent of the recording medium or media 14 can be acquired.

In the exemplary embodiment according to FIG. 1, a single linear image acquisition device 25 is provided. This may for example be configured in the form of a scanning strip, which acquires an image line-by-line from the recording medium 14 during the traversing movement in the Y direction. The acquired data are assembled into a complete image by means of a frame-grabber card. The position and/or orientation of the at least one recording medium 14 and/or the position of the at least one image 21 can be acquired thereby. Preferably the recording medium 14 has at least two, preferably three, measuring points, in order to acquire the X/Y position of the recording medium 14 on the support 12 and the orientation of the recording medium 14 on the support 12. A similar situation applies to the images 21.

The linear image acquisition device 25 may comprise LED illumination, to allow shadow-free illumination of the recording medium 14 for image acquisition. The image acquisition device may have chips, especially CMOS chips, for high-speed image recording. Alternatively, IR radiation may be provided. A combination may also be provided.

In the exemplary embodiment according to FIG. 1, the linear image acquisition device 25 is provided on the sliding arrangement 19. Alternatively, the sliding arrangement 19 may be assigned a separately controllable sliding arrangement 19', which holds the linear image acquisition device 25 exclusively. A scanning motion of the linear image acquisition device 25 can therefore be activated independently of the exposure heads 16, 17.

Figure 2:
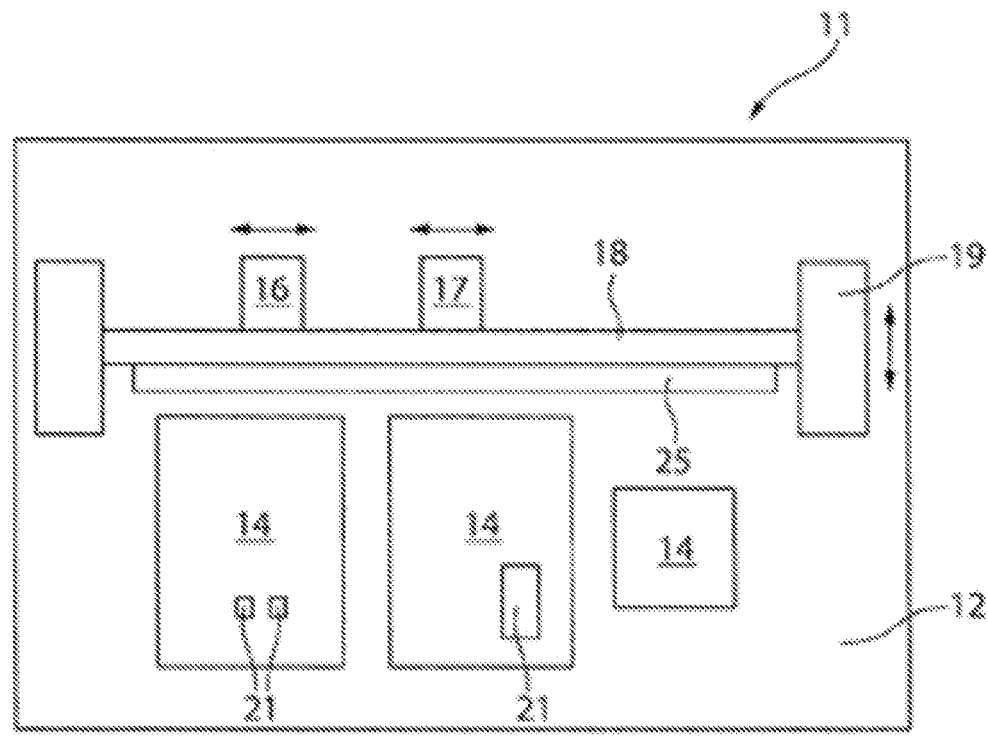
FIG. 2, a schematic view of an alternative embodiment of the exposure device in FIG. 1, FIG. 3, a perspective partial view of a further alternative embodiment of the exposure device according to FIG. 2, and FIG. 4, a perspective view of a further alternative embodiment of the exposure device in FIG. 1.

FIG. 2 shows a schematic view of an alternative embodiment of the exposure device 11 in FIG. 1. In this alternative embodiment the linear image acquisition device 25 is fastened directly on the guiding axis 18. This linear image acquisition device 25 may be provided laterally, i.e. opposite the exposure heads, on the guiding axis 18, as shown in FIG. 2.

Figure 3:
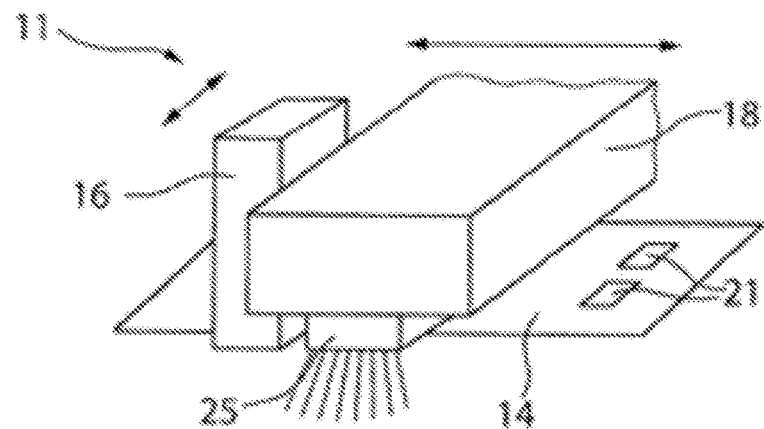

Alternatively, the linear image acquisition device 25 may also be positioned under the guiding axis 18, i.e. between the guiding axis 18 and the support 12. This embodiment is shown for example in FIG. 3. In the embodiment according to FIGS. 2 and 3, the exposure heads 16, 17 and the linear image acquisition device 25 are moved together by means of the guiding axis 18.

Figure 4:
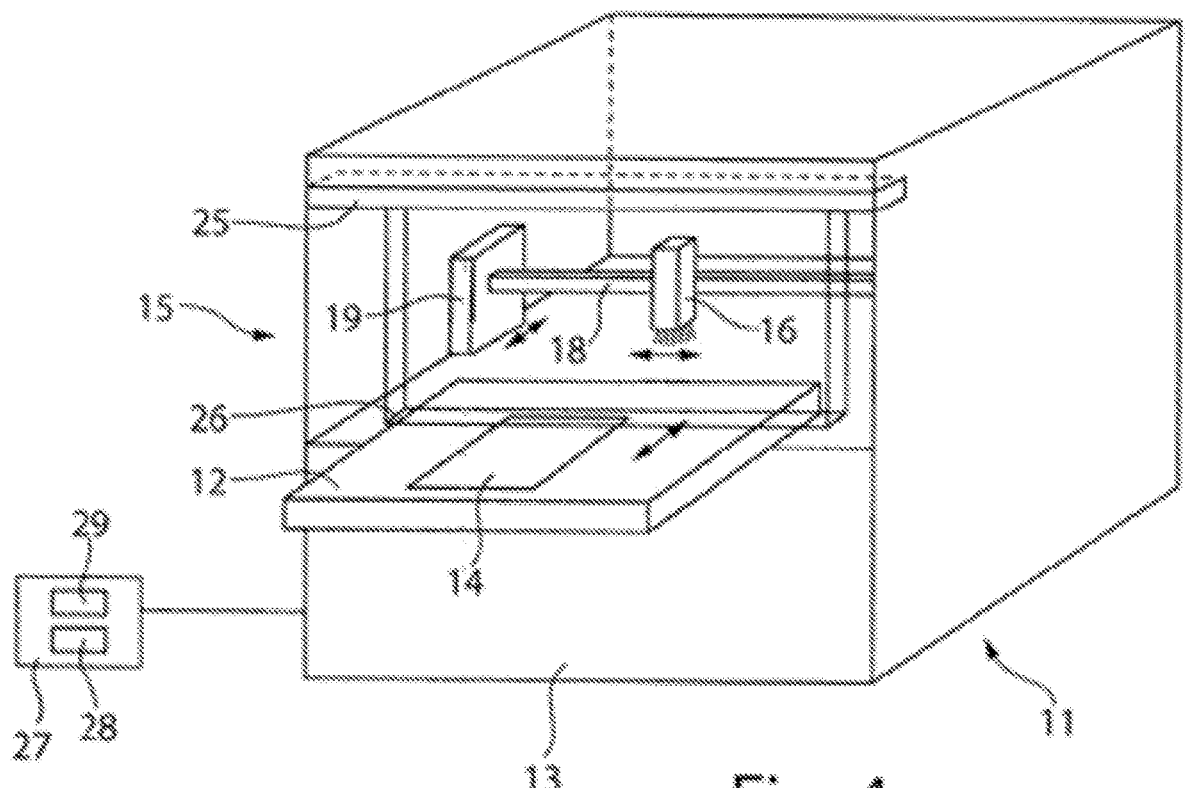

A further alternative embodiment of the exposure device 11 is shown in perspective in FIG. 4. This exposure device 11 comprises a housing 13 with a machine main frame, on which the support 12 is held moveably. On the operator side, a housing opening 15 is provided in the housing 13, through which the support 12 can be moved out at least partially for placement of at least one recording medium 14. The support 12 can also be moved out of the housing 13 for removing the at least one recording medium 14 from this support 12. The linear image acquisition device 25 can be fixed on an upper front end of the housing opening 15 of the housing 13. This makes it possible for the position and/or orientation of the recording medium 14 to be detected already during inward travel of the support 12 into the housing 13. Moreover, the position and/or orientation of the at least one image 21 can be detected. Preferably a complete image can be acquired from the at least one recording medium 14 present on the support 12.

After the support 12 has been introduced into the housing 13, the exposure process can be started in a processing or exposure position to the at least one exposure head 16.

Alternatively, it may be provided that the image acquisition device 25 is moveable at least partially in the Y direction, so that starting from the housing opening 15 this can be moved at least partially into the interior of the housing. As a result, by means of a relative movement between the image acquisition device 25 and the support 12, the acquisition of a complete image of the at least one recording medium 14 and/or of the at least one image 21 on the support 12 also becomes possible.

The linear image acquisition device 25 is preferably selected in length so that it extends over the full width of the support 12, thus in the X direction, at right angles to the traversing movement of the support 12. A scanning field 26 can be created thereby, which extends linearly or in the form of a narrow strip over the complete support 12.

For the exposure device 11, a control system 27 is provided, which comprises an operator interface 28 and optionally a display 29. The individual program steps and procedures can be input and/or started via this.

I claim:

1. Method for exposing at least one stored image, having a stored target location and a stored target orientation, on a light-sensitive recording medium held on a support, the support having a width along an X direction and length along a Y direction, the method comprising:

a. acquiring an image of the entire light-sensitive recording medium and the support by a single linear image acquisition device, the single linear image acquisition device extending along the X direction over the complete width of the support, and, the single linear image acquisition device moved in the Y direction by a control system while acquiring a plurality of images of the light-sensitive recording medium and support, producing an acquired image of the entire support and light-sensitive recording medium by combining the plurality of images, the acquired image produced in a single traversal of the support by the single linear image acquisition device, and, b. determining a location and an orientation for the light-sensitive recording medium on the support from the acquired image, and, c. exposing the at least one stored image onto the light-sensitive recording medium by moving and actuating an at least one exposure head across the light-sensitive recording medium and support, where the moving and actuating of the at least one exposure head are controlled by, and, the moving of the at least one exposure head exposing is corrected by, the control system by comparing the stored target location and the stored target orientation with the location and the orientation of the light-sensitive recording medium on the support as determined from the acquired image.

2. Method according to claim 1, wherein the light-sensitive recording medium further includes a second image located on the light-sensitive recording medium and the determining the location and orientation includes determining the location and orientation of the second image on the light-sensitive recording medium, and, the moving and actuating of the at least one exposure head are controlled by, and, are corrected by the control system by comparing the location and the orientation of the second image, as determined from the acquired image, with the position of the stored target location and the stored target orientation.

3. The method according to claim 2, wherein the exposing the at least one stored image onto the light-sensitive recording medium includes exposing a plurality of stored images.

4. The method according to claim 2, further including a stored target size for the second image and the determining the location and orientation of the recording medium further includes determining an actual size of the second image, and, the moving and actuating of the at least one exposure head are controlled by, and, are further corrected by the control system by comparing the actual size of the second image with the stored target size of for the second image.

5. Method according to claim 1, wherein the exposing the at least one stored image onto the light-sensitive recording medium includes exposing a plurality of stored images.

6. Method according to claim 1, further including a stored target size for the recording medium and determining the location and orientation of the recording medium further includes determining an actual size of the recording medium and the moving and actuating of the at least one exposure head are controlled by, and, are further corrected by the control system by comparing the actual size of the recording medium with the stored target size of for the recording medium.

7. The method of claim 1 wherein the acquiring an image is done using IR illumination.

8. An exposure device for exposing at least one stored image on a light-sensitive recording medium having a width and a length, the exposure device comprising:

a. at least one exposure head, the at least one exposure head moveable along a first axis across the width of the light-sensitive recording medium, with a movement that is larger than a light-beam sending field of the at least one exposure head, and, is moveable along a second axis, the second axis perpendicular to the first axis, and, the movement of the at least one exposure head along the second axis covering the length of the light-sensitive recording medium, and, b. a support, having a width and a length, on which the light-sensitive recording medium is positioned, and, c. a linear image acquisition device for recording a complete image of the recording medium and the support, which extends along the first axis over the complete width of the support, and, is movable along the second axis, and, d. a control system, that controls movement of the at least one exposure head along both the first and second axis, and, controls movement of the linear image acquisition device, along the second axis, and, controls the actuation of the at least one exposure head for exposing at least one stored image on the light-sensitive recording medium, and, controls the linear image acquisition device to obtain the complete image of the complete light-sensitive recording medium and the support, and is programmed to adjust the control of the at least one exposure head based upon a comparison of the acquired image with a stored location and a stored orientation of the at least one stored image.

9. Exposure device according to claim 8, wherein the linear image acquisition device is provided on a third axis, which is moveable independently of the first axis in the Y direction relative to the support.

10. Exposure device according to claim 8, wherein the linear image acquisition device is fixed to a housing opening of a housing of the exposure device and the support is movable out at least partially from the housing opening of the housing.

11. Exposure device of claim 8 wherein IR radiation is used for acquisition of the complete image by the linear image acquisition device.

* * * * *